(12) United States Patent
Chen et al.

(10) Patent No.: US 7,415,660 B2
(45) Date of Patent: Aug. 19, 2008

(54) ERROR CORRECTION CODE GENERATOR

(75) Inventors: Hong-Ching Chen, Kao Hsiung Hsien (TW); Meng-Hsueh Lin, Taipei Hsien (TW); Wen-Yi Wu, Hsin Chu Hsien (TW); Li-Lien Lin, Hsin Chu (TW)

(73) Assignee: Media Tek Inc, Hsin-Chu (TW)

( * ) Notice: Subject to any disclaimer, the term of this patent is extended or adjusted under 35 U.S.C. 154(b) by 653 days.

(21) Appl. No.: 10/912,155

(22) Filed: Aug. 6, 2004

(65) Prior Publication Data

US 2005/0193317 A1 Sep. 1, 2005

(30) Foreign Application Priority Data

Feb. 20, 2004 (TW) ............................... 93104359 A

(51) Int. Cl.
*H03M 13/00* (2006.01)

(52) U.S. Cl. .................................... 714/784

(58) Field of Classification Search ............... 714/755, 714/784
See application file for complete search history.

(56) References Cited

U.S. PATENT DOCUMENTS 5,311,522 A * 5/1994 Murakami ............... 714/755
5,386,425 A * 1/1995 Kim ........................ 714/755

* cited by examiner

*Primary Examiner*—Shelly A Chase
(74) *Attorney, Agent, or Firm*—Birch, Stewart, Kolasch & Birch, LLP

(57) ABSTRACT

An error correction code generator uses an additional static random access memory (SRAM) or a multi-symbol encoder to improve the encoding efficiency. During the encoding operation, the number of the data access of the dynamic random access memory (DRAM) with the row address switching can be reduced considerably via using the additional SRAM or multi-symbol encoder. Hence, the efficiency of the data access of the DRAM is improved and the encoding time of the error correction code generator is reduced.

37 Claims, 10 Drawing Sheets

FIG. 1
PRIOR ART

| row address \ column address | 0 | 1 | 2 | 3 | ... | 90 | 91 | ... | 111 | ... | 126 | 127 |
|---|---|---|---|---|---|---|---|---|---|---|---|---|
| 0 | $B_{0.0}$ | $B_{0.1}$ | $B_{0.2}$ | $B_{0.3}$ | ... | $B_{0.180}$ | $B_{0.181}$ | | | | | |
| 1 | $B_{1.74}$ | $B_{1.75}$ | $B_{1.76}$ | $B_{1.77}$ | ... | $B_{1.0}$ | $B_{1.1}$ | ... | $B_{1.40}$ | $B_{1.41}$ | ... | $B_{1.70}$ | $B_{1.71}$ | $B_{1.72}$ | $B_{1.73}$ |
| 2 | $B_{2.148}$ | $B_{2.149}$ | $B_{2.150}$ | $B_{2.151}$ | | | | | | | $B_{2.144}$ | $B_{2.145}$ | $B_{2.146}$ | $B_{2.147}$ |
| .. | .. | .. | .. | .. | | | | | | | $B_{4.36}$ | $B_{4.37}$ | $B_{4.38}$ | $B_{4.39}$ |
| 147 | .. | .. | .. | .. | | | | | $B_{207.180}$ | $B_{207.181}$ | | .. | .. | .. | .. |

ERROR CORRECTION CODE GENERATOR

This Non-provisional application claims priority under 35 U.S.C. §119(a) on Patent Application No. 93104359 filed in Taiwan, Republic of China on Feb. 20, 2004, the entire contents of which are hereby incorporated by reference.

BACKGROUND OF THE INVENTION

1. Field of the Invention

The present invention is related to an error correction code generator, and more particularly, to an error correction code generator that uses an additional static random access memory (SRAM) or a multi-symbol encoder to improve the encoding efficiency thereof.

2. Description of Related Art

Traditionally, in a process for generating error correction codes, such as in the encoding process executed before recoding data on a digital versatile disc (DVD), the source data are usually pre-stored in a dynamic random access memory (DRAM). In the conventional DRAM, the stored data are usually addressed by the row and column addresses, and the DRAM is divided into multiple memory blocks according to the row and column addresses.

When the error correction code generator accesses the data stored in the DRAM, a row address and a column address are sent to the DRAM to indicate which data to be accessed. However, in order to make the data access more efficient, the conventional DRAM generally has a page-mode access function. In other words, if the data to be accessed have the same row address, i.e. they have the same memory page, the error correction code generator only needs to send the row; address when accessing the first data. The following data can be accessed just by sending the column addresses.

Furthermore, the DRAM only charges the memory blocks with the same row address when activating those memory blocks. Hence, every time the error correction code generator tries to access data with a different row address, it not only needs to send a row address but also to wait for a predetermined charge time. Thus, if the number of the row address switching of the data to be accessed increases, the access efficiency of the DRAM will decrease considerably.

In a conventional process for generating error correction codes, such as a process for generating parity of outer codes (PO codes) of Reed-Solomon product code (RSPC), accessing data blocks with different row addresses is often necessary. As a result, it needs to switch the new row address and wait for the predetermined charge time to access the data in different row addresses and the efficiency for generating the error correction codes is limited. Hence, the conventional process for generating error correction codes will consume a lot of time.

Please refer to FIG. 1, which is a conventional data structure for the Reed-Solomon product code. The conventional data structure includes three blocks, which are composed of multiple sub-blocks. Each of the sub-blocks represents a symbol of the operation of the error correction code and includes a byte of data. The sub-blocks are respectively marked as $\{B_{i,j}, i=0-207, j=0-181\}$.

The block at $i=0-191$ and $j=0-171$ is the scrambled source data; the block at $i=192-207$ and $j=0-171$ is the PO codes of Reed-Solomon product code; and the block at $i=0-207$ and $j=172-181$ is the parity of inner codes (PI codes) of Reed-Solomon product code.

The PO codes are the vertical parity codes of the source data. For example, the PO code of the PO column with $i=0$, $B_{0-191, 0}$, is $B_{192-207, 0}$. The PI codes are the horizontal parity codes of the source data. For example, the PI code of the PI row with $j=0$, $B_{0, 0-171}$, is $B_{0, 172-181}$.

Please refer to FIG. 2, which is a schematic diagram for illustrating the arrangement of the scrambled source data in the DRAM. Before encoding, the conventional error correction code generator generates a sequence of scramble bytes in advance to scramble the source data received from the host. Then, it stores the scrambled source data into the DRAM. Finally, the error correction code generator encodes the scrambled source data according to the Reed-Solomon product code.

By comparing FIG. 1 with FIG. 2, the stored DRAM addresses of the scrambled source data are shown. It is noted that the storage unit of the DRAM is "word", which is equal to two bytes in this case. The order of storing the scrambled source data is $(B_{0,0}, B_{0,1}, \ldots B_{0,171}, B_{1,0}, \ldots)$.

According to the order of storing the scrambled source data, the row addresses of the source data for generating the PO codes of Reed-Solomon product code are frequently switched. Hence, in the process for generating the PO codes, the efficiency of conventional error correction code generator is low (the following description is directed to this question).

Please refer to FIG. 3, which is a block diagram of a conventional error correction code generator. The conventional error correction code generator 30 includes a first memory (DRAM) 31, a multiplexer 32 and an encoder 33. In the process of encoding, the host sends source data to the error correction code generator 30. Then, the error correction code generator 30 scrambles the source data and stores the scrambled source data into the first memory 31.

Then, the error correction code generator 30 accesses the scrambled source data stored in the first memory 31 column by column for generating the PO codes. However, as shown in FIG. 2, the storage unit of first memory 31 is "word". Hence, two bytes of the data are read from first memory each time, and the multiplexer 32 selects the required byte of these two bytes and passes it to the encoder 33 for encoding.

Please refer to FIG. 2 again. According to the encoding structure and method described above, the operation of the vertical encoding should be executed 172 times to complete the total process for generating the PO codes. However, in order to execute the operation of the vertical encoding, e.g. encoding the data in $B_{0-191,0}$ to generate the corresponding PO code in $B_{192-207}$, the data accessing operation with row address switching should be performed 135 times and the data accessing operation without row address crossing should be performed 57 times.

Therefore, to complete the whole process for generating the PO codes, it totally performs 172×135=23220 times of the data access with row address switching and 172×57=9804 times of the data access without row address switching. Since the data access with row address switching is more time-consuming and this encoding method needs to access data mostly with row address switching, this encoding structure is inefficient and consumes a lot of time.

Accordingly, as discussed above, the prior art still has some drawbacks that could be improved. The present invention aims to resolve the drawbacks in the prior art.

SUMMARY OF THE INVENTION

An objective of the present invention is to provide an error correction code generator and an encoding method. They are used to improve the encoding efficiency and reduce the encoding time via reducing the number of the data access with row address switching.

Another objective of the present invention is to provide an error correction code generator, which uses an additional SRAM to reduce the number of the data access with row address switching so as to improve the encoding efficiency and reduce the encoding time.

Still another objective of the present invention is to provide an error correction code generator, which uses a multi-symbol encoder to reduce the number of the data access with row address switching so as to improve the encoding efficiency and reduce the encoding time.

For reaching the objective above, the present invention provides an error correction code generator, which includes a first memory (DRAM), a second memory (SRAM), a memory access controller and an encoder. During the encoding operation, the number of the data access with row address switching for the first memory can be reduced considerably via accessing multiple PO columns of the source data from the first memory in advance and temporarily storing them into the second memory.

Moreover, for reaching the objective above, the present invention provides another error correction code generator, which includes a memory (DRAM), a memory access controller and a multi-symbol encoder. During the encoding operation, the number of the data access with row address switching for the memory can be reduced considerably via directly accessing multiple PO columns of the source data from the first memory and encoding them by the multi-symbol encoder.

Numerous additional features, benefits and details of the present invention are described in the detailed description as follows.

BRIEF DESCRIPTION OF THE DRAWINGS

Figure 1:
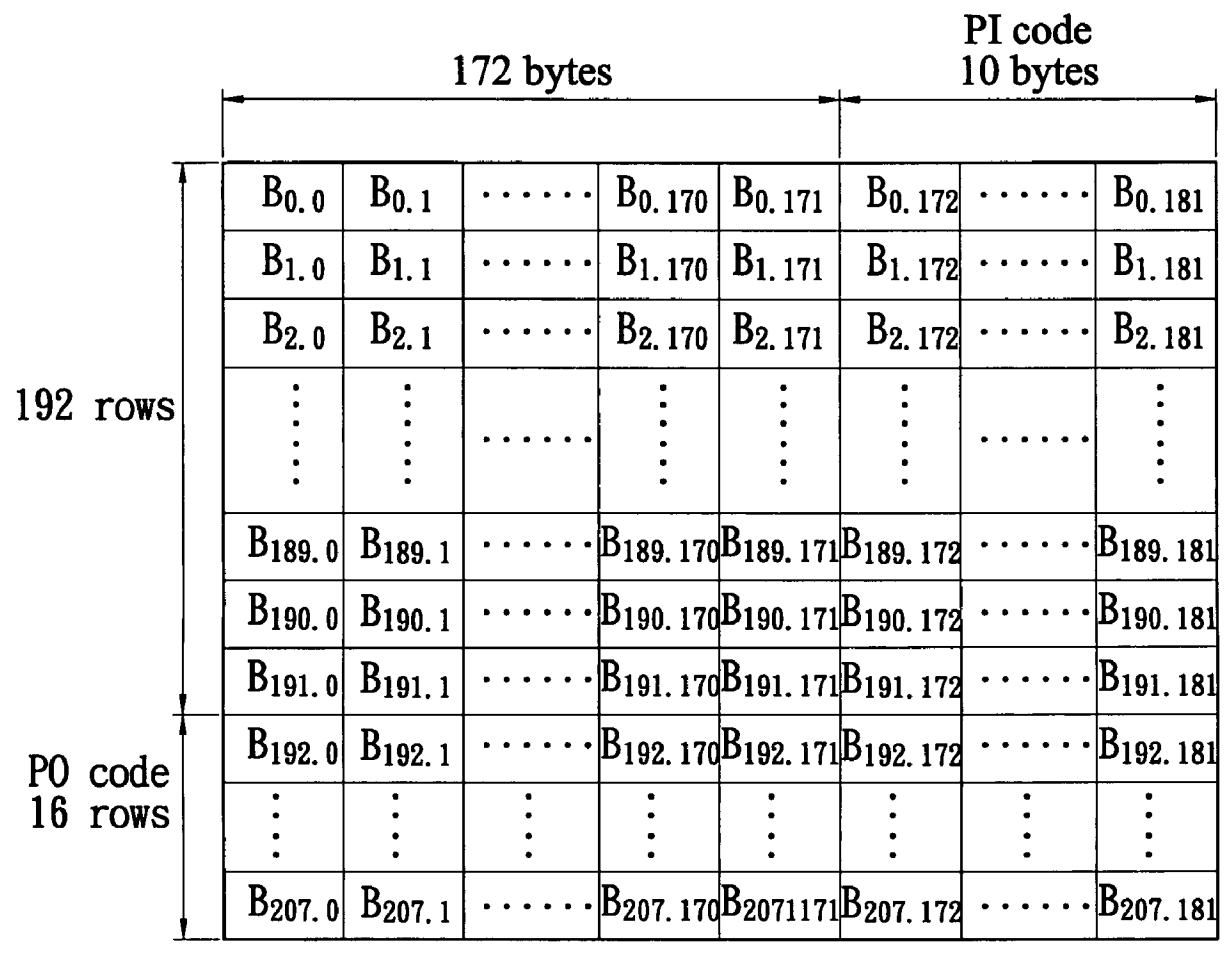

FIG. 1 is a conventional data structure for Reed-Solomon product code;

FIG. 2 is a schematic diagram for illustrating the arrangement of the scrambled source data in the DRAM;

FIG. 5 is schematic diagram illustrating an accessing order of the DRAM in accordance with the present invention;

DETAILED DESCRIPTION OF PREFERRED EMBODIMENTS

Figure 3:
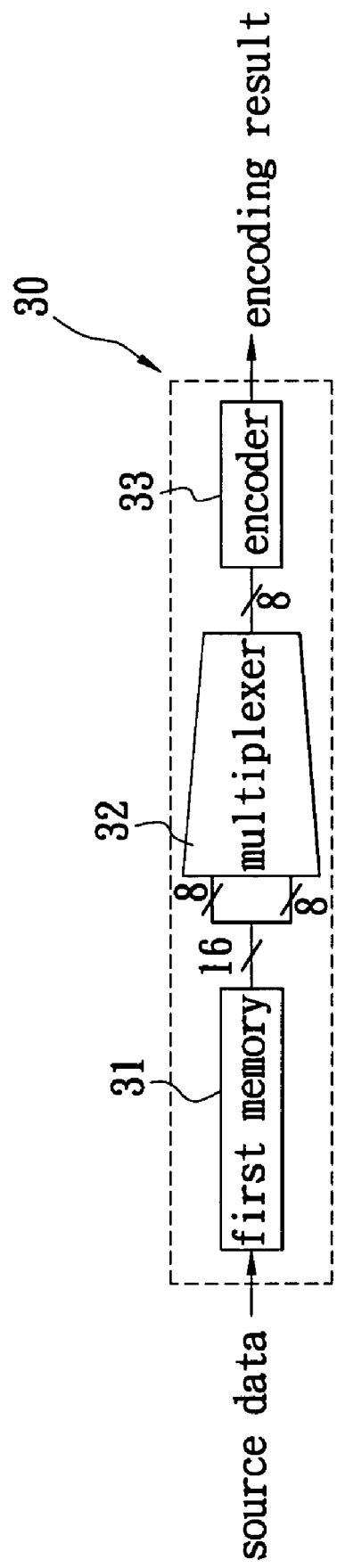
FIG. 3 is a block diagram of a conventional error correction code generator.
Figure 4:
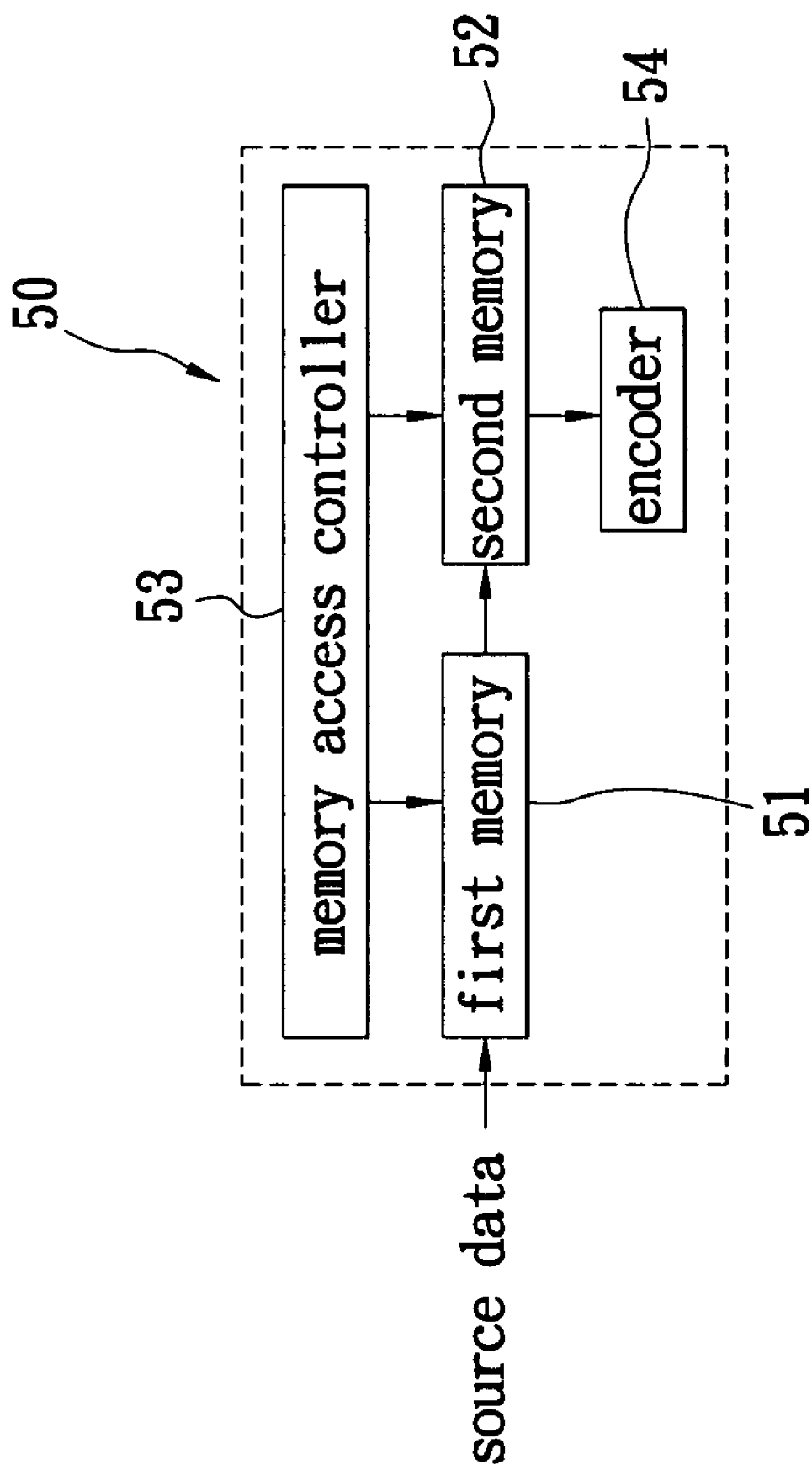
FIG. 4 is a block diagram of an embodiment in accordance with the present invention.

Please refer to FIG. 4, which is a block diagram of a embodiment in accordance with the present invention. As shown in the figure, the present invention provides an error correction generator 50, which includes a first memory 51, a second memory 52, a memory access controller 53 and an encoder 54. The first memory 51 is a dynamic random access memory (DRAM) and the second memory 52 is a static random access memory (SRAM).

As in the prior art mentioned above, in the encoding process, the host sends source data to the error correction generator 50 and the error correction generator 50 scrambles the source data and store the scrambled source data into the first memory 51, i.e. storing the scrambled source data in a DRAM. The scrambled source data can be one or multiple data blocks, where the data block comprises multiple rows (PI rows) and multiple columns (PO columns) arranged in matrix. According to the present invention, most of the data in the same row of the data block should be stored in the same memory page of the first memory 51 to reduce the storing time.

In the process for generating the PO codes, the memory access controller 53 controls the first memory 51 and the second memory 52 to access a part of the source data from the first memory 51 for encoding. The memory access controller 53 accesses multiple PO columns of the source data from the first memory 51 and stores these data into the second memory 52. Then, the encoder 54 accesses the PO columns of the source column by column from the second memory 52 and performs the encoding process to generate the PO codes.

Since the second memory 52 is the SRAM whose access speed is faster than that of the DRAM, i.e. faster than the access speed of the first memory 51, the second memory 52 won't reduce the encoding efficiency.

Instead of directly accessing the PO columns of the source data column by column from the first memory 51, this embodiment accesses multiple PO columns of the source data from the first memory 51 and stores these data into the second memory 52 for the further encoding of the encoder 54, which efficiently reduces the number of the data access with row address switching during accessing the first memory 51. Therefore, this embodiment increases the efficiency of data access and reduces the encoding time considerably.

Figure 5:
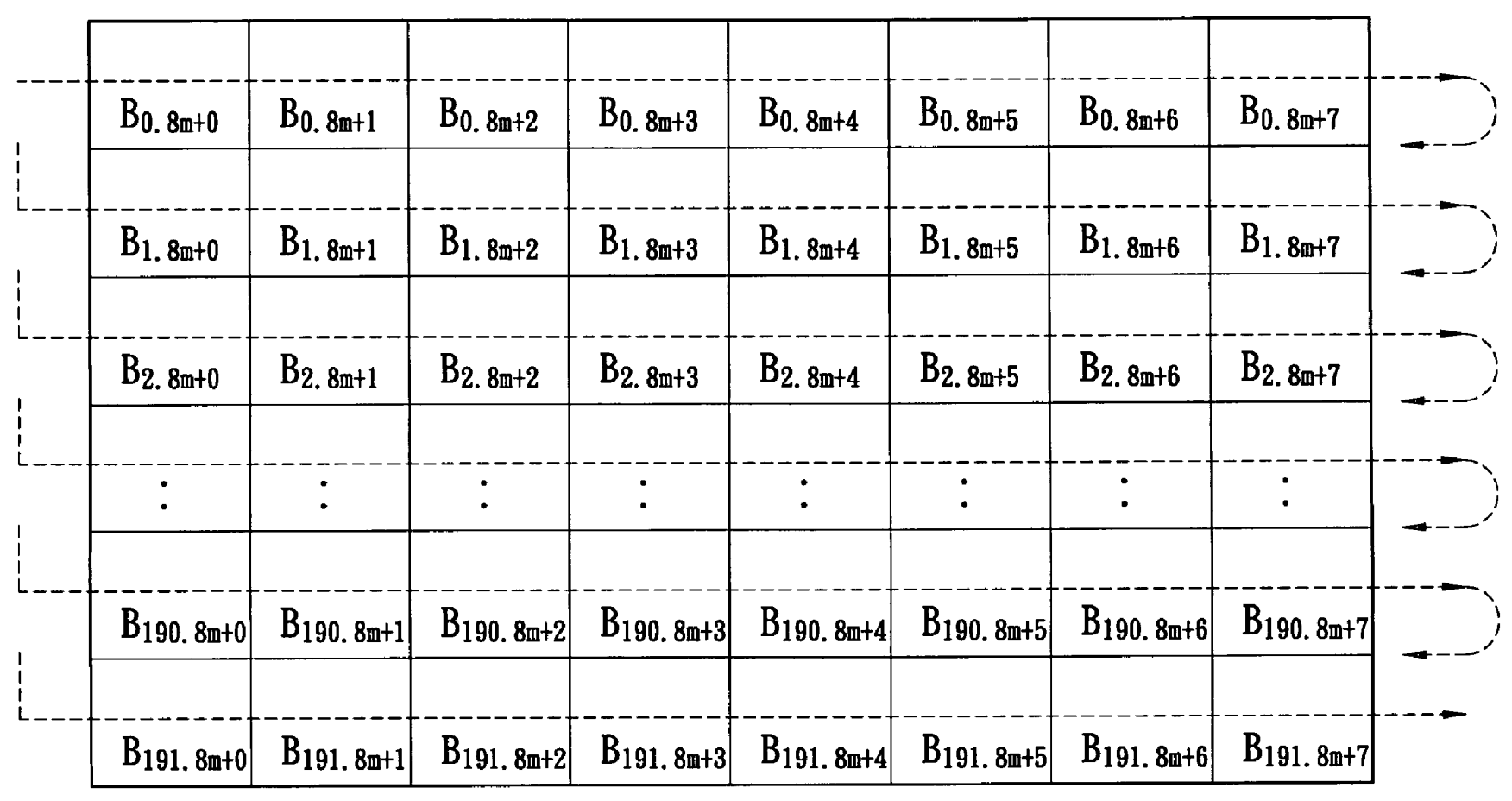

In order to illustrate the embodiment, please refer to FIG. 5, which is a schematic diagram illustrating the order of accessing the DRAM in accordance with the present invention. In this embodiment, an SRAM capable of storing eight PO columns is used. As shown in the figure, before generating the PO codes, the memory access controller 53 accesses eight PO columns of the source data from the first memory 51 in the order shown by the arrows and stores them into the second memory 52.

Since this embodiment accesses eight PO columns of the source data from the first memory 51 in advance and stores these data into the second memory 52 for the further encoding of the encoder 54, it performs 135 times of the data access with row address switching and (192×4−135) times of data access without row address to access the eight PO columns of the source data from the first memory 51. Hence, in order to generate completely the PO codes for the data block, it performs $(172/8) \times (192 \times 4 - 135) \approx 2903$ times of the data access with row address switching and $(172/8) \times (192 \times 4 - 135) \approx 13640$ times of the data access without row address switching.

Furthermore, in addition to the order of accessing the DRAM shown in FIG. 5, there are various orders of accessing the DRAM that can be applied to the present invention. The only requirement for the orders of accessing is to make the data with the same row address able to be continuously accessed as far as possible to reduce the accessing time of the first memory 51. For example, the accessing order can be $\{B_{0,8m+0} \ B_{0,8m+1} \ B_{0,8m+4} \ B_{0,8m+5} \ B_{0,8m+2} \ B_{0,8m+3} \ B_{0,8m+6} \ B_{0,8m+7} \ldots \}$.

In addition, if one memory page of the first memory 51 (i.e. the memory portion with the same row address) can store multiple PI rows of the data, the requirement of the orders of accessing the DRAM in the present invention is to make the data of these PI rows able to be continuously accessed as far as possible to reduce the accessing time of the first memory 51. As shown in FIG. 2, one memory page can store about two PI rows of the data. Hence, the order of accessing the DRAM shown in FIG. 5 can be changed to $\{B_{0,8m+0} B_{1,8m+0} B_{0,8m+1} B_{1,8m+1} B_{0,8m+2} B_{1,8m+2} B_{0,8m+3} B_{1,8m+3} \ldots\}$, which still can reduce the accessing time of the first memory 51.

Compared with the prior art, the number of the data access with row address switching in the embodiment of the present invention is obviously reduced. Hence, the present invention can improve the efficiency of DRAM access and lower the encoding time considerably.

Figure 6:
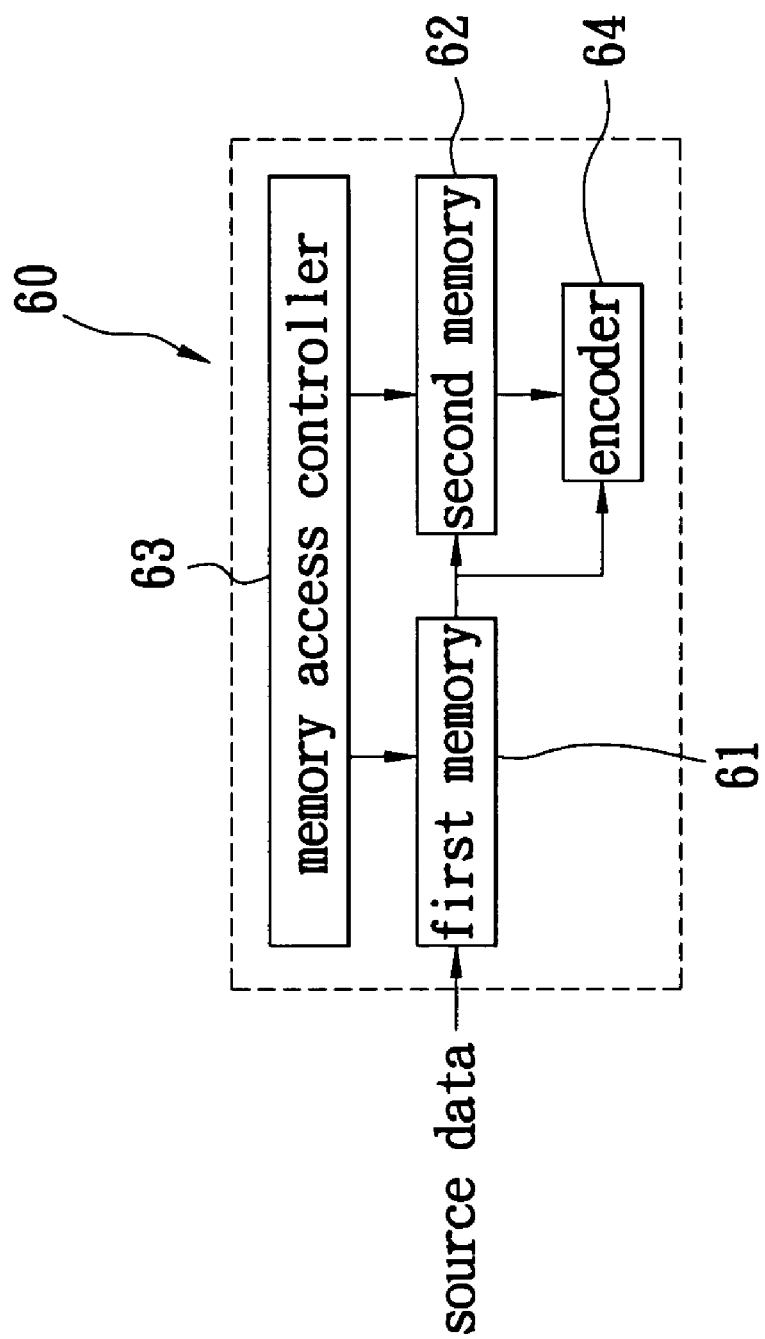
FIG. 6 is a block diagram of another embodiment in accordance with the present invention.

Please refer to FIG. 6, which is a block diagram of another embodiment in accordance with the present invention. As shown in the figure, the present invention provides an error correction code generator 60, which includes a first memory 61, a second memory 62, a memory access controller 63 and an encoder 64. The first memory 61 is a DRAM and the second memory 62 is an SRAM.

As the embodiment shown in FIG. 4, in the encoding process of this embodiment, the host sends the source data to the error correction code generator 60. Then, the error correction generator 60 scrambles the source data and stores the scrambled source data into the first memory 61.

Afterwards the memory access controller 63 controls the first memory 61 and the second memory 62 to access multiple PO columns of the source data from the first memory 61. It directly sends one of the accessed PO columns to the encoder and stores the rest of PO columns into the second memory 62. Then, the encoder 64 accesses the remaining PO columns stored in the second memory 62 column by column to generate the PO codes.

This embodiment is similar to the embodiment shown in FIG. 4. The difference is that this embodiment directly sends one of the PO columns accessed from the first memory 61 to the encoder 64 to reduce the required size of the second memory 62 so as to reduce the cost of the second memory 62.

Figure 7:
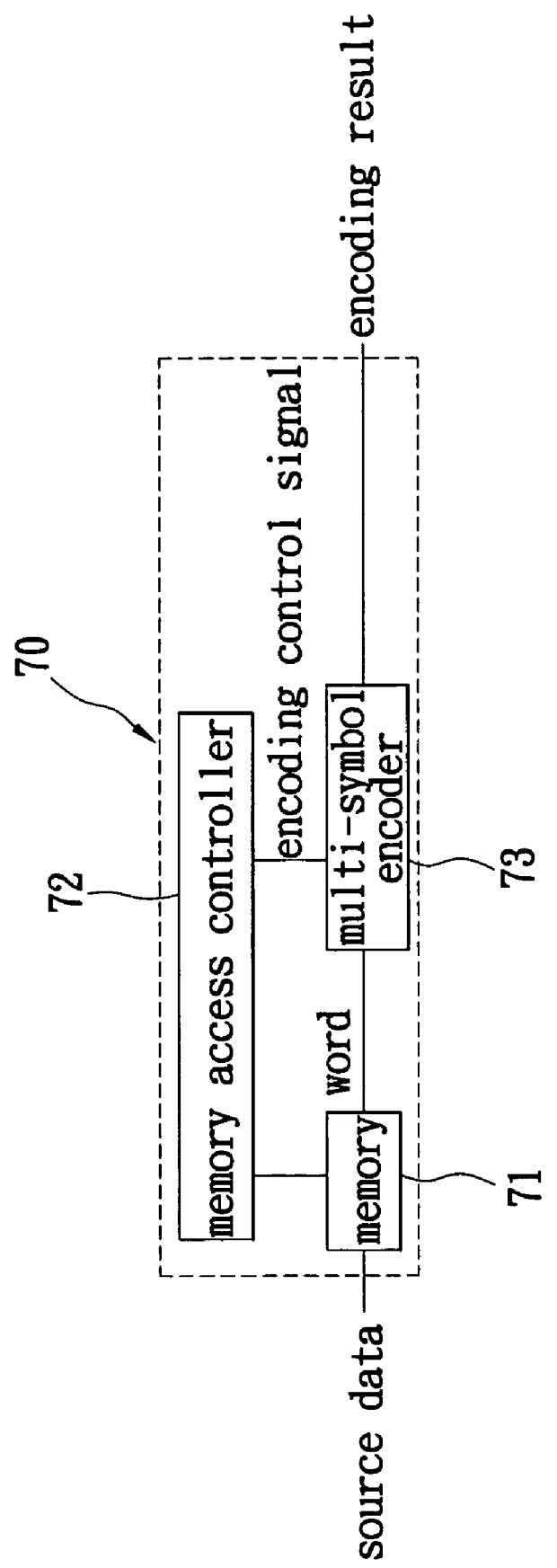
FIG. 7 is still a block diagram of another embodiment in accordance with the present invention.

Please refer to FIG. 7, which is still a block diagram of another embodiment in accordance with the present invention. As shown in the figure, the present invention provides an error correction code generator 70, which includes a memory 71, a memory access controller 72 and a multi-symbol encoder 73. The first memory 71 is a DRAM.

As in the embodiment shown in FIG. 4, in the encoding process of this embodiment, the host sends the source data to the error correction code generator 70. Then, the error correction generator 70 scrambles the source data and stores the scrambled source data into the memory 71. Afterwards the memory access controller 72 controls the memory 71 to access multiple PO columns of the source data from the memory 71. Each time a word having multiple data units are accessed from the memory 71, the encoding speed of the multi-symbol encoder 73 is sufficient to complete the encoding operation related to the word before the next word are accessed from the memory 71.

Similarly, instead of accessing the PO columns of the source data column by column from the first memory 71, this embodiment accesses multiple PO columns of the source data from the first memory 71 simultaneously and sends them to the multi-symbol encoder-73 for encoding, this embodiment can efficiently reduce the number of the data access with row address switching during accessing the first memory 71. Hence, this embodiment can reduce the encoding time considerably.

The concept of this embodiment is similar to the embodiment shown in FIG. 4. The difference is that the embodiment shown in FIG. 4 uses an SRAM to reduce the number of the data access with row address switching while this embodiment uses a multi-symbol encoder.

Figure 8:
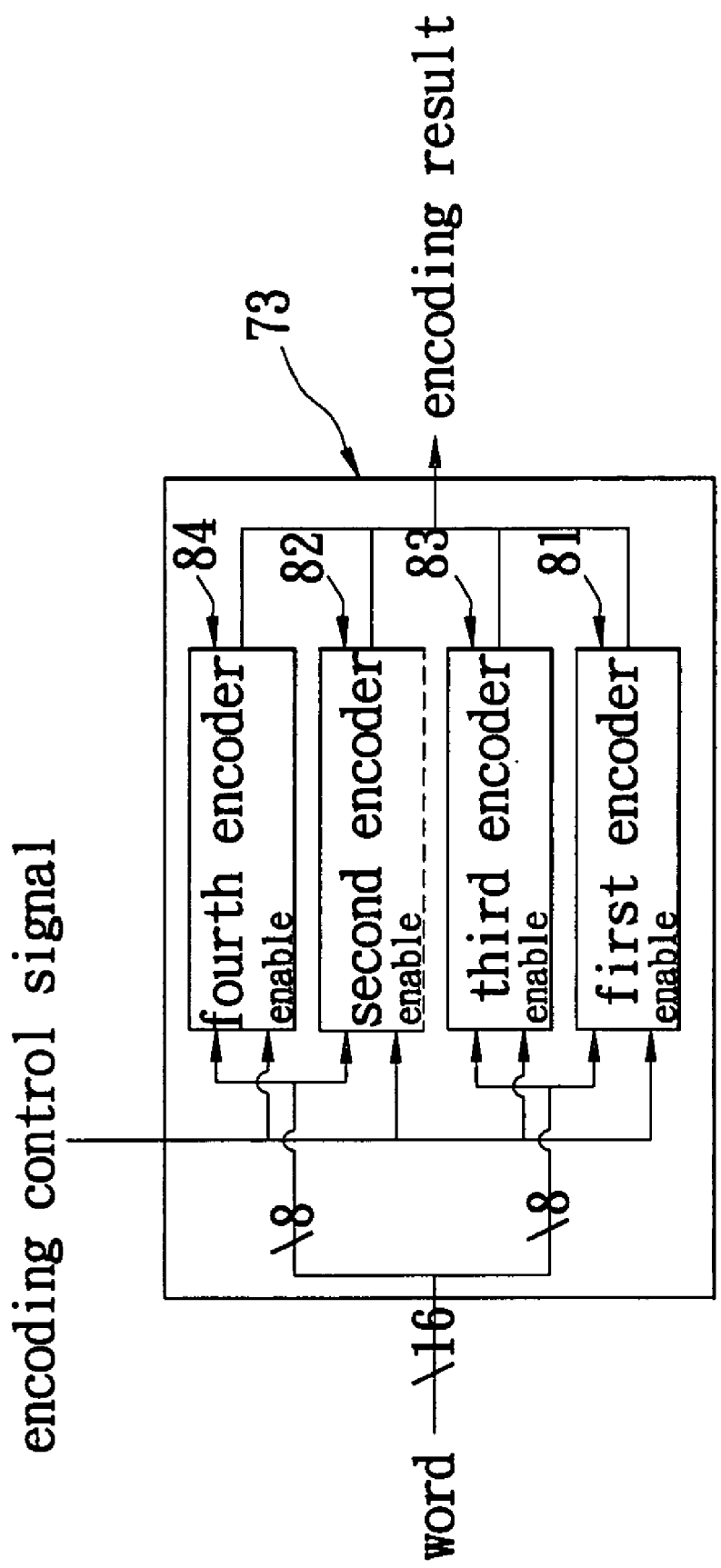
FIG. 8 is a block diagram of an embodiment of a multi-symbol encoder in accordance with the present invention.

Please refer to FIG. 8, which is a block diagram of a embodiment of the multi-symbol encoder 73 in accordance with the present invention. A word in the memory 71 has two data units and the multi-symbol encoder 73 accesses four PO columns of the source data from the memory 71, which can be represented by $\{B_{i,4n+j}, i=0\text{-}191, j=0\text{-}3\}$. The accessing order is $\{B_{0, 4n+0} B_{0, 4n+1} B_{0, 4n+2} B_{0, 4n+3} B_{1, 4n+0} B_{1, 4n+1} B_{1, 4n+2} B_{1, 4n+3} \ldots\}$. As shown in the figure, the multi-symbol encoder 73 includes a first encoder 81, a second encoder 82, a third encoder 83 and fourth encoder 84. The first encoder 81 is used to encode the PO column represented as $\{B_{i,4n+0}, i=0\text{-}191\}$, the second encoder 82 is used to encode $\{B_{i,4n+1}, i=0\text{-}191\}$, the third encoder 83 is used to encode $\{B_{i,4n+2}, i=0\text{-}191\}$ and the fourth encoder 84 is used to encode $\{B_{i,4n+3}, i=0\text{-}191\}$.

Figure 9:
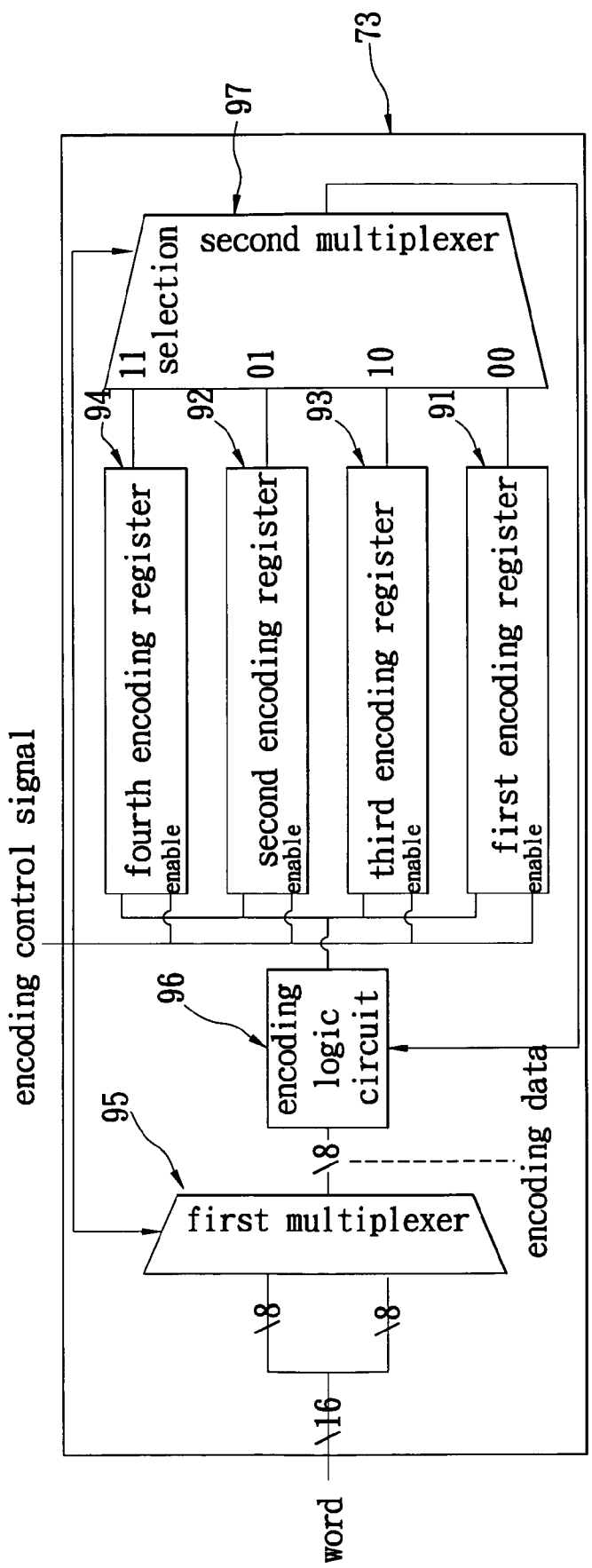
FIG. 9 is a block diagram of another embodiment of the multi-symbol encoder in accordance with the present invention.

Please refer to FIG. 9, which is a block diagram of another embodiment of the multi-symbol encoder 73 in accordance with the present invention. A word in the memory 71 includes two data units and the multi-symbol encoder 73 accesses four PO columns of the source data from the memory 71, which can be represented by $\{B_{i,4n+j}, i=0\text{-}191, j=0\text{-}3\}$. The accessing order is $\{B_{0, 4n+0} B_{0, 4n+1} B_{0, 4n+2} B_{0, 4n+3} B_{1, 4n+0} B_{1, 4n+1} B_{1, 4n+2} B_{1, 4n+3} \ldots\}$.

As shown in the figure, the multi-symbol encoder 73 includes a first encoding register 91, a second encoding register 92, a third encoding register 93, a fourth encoding register 94, a first multiplexer 95, an encoding logic circuit 96 and a second multiplexer 97. The encoding logic circuit 96 is used for encoding calculation. The first encoding register 91 is used together with the encoding logic circuit 96 to encode the PO column represented as $\{B_{i,4n+0}, i=0\text{-}191\}$; the second encoding register 92 is used together with the encoding logic circuit 96 to encode $\{B_{i,4n+1}, i=0\text{-}191\}$; the third encoding register 93 is used together with the encoding logic circuit 96 to encode $\{B_{i,4n+2}, i=0\text{-}191\}$; and the fourth encoding register 94 is used together with the encoding logic circuit 96 to encode $\{B_{i,4n+3}, i=0\text{-}191\}$.

Figure 10:
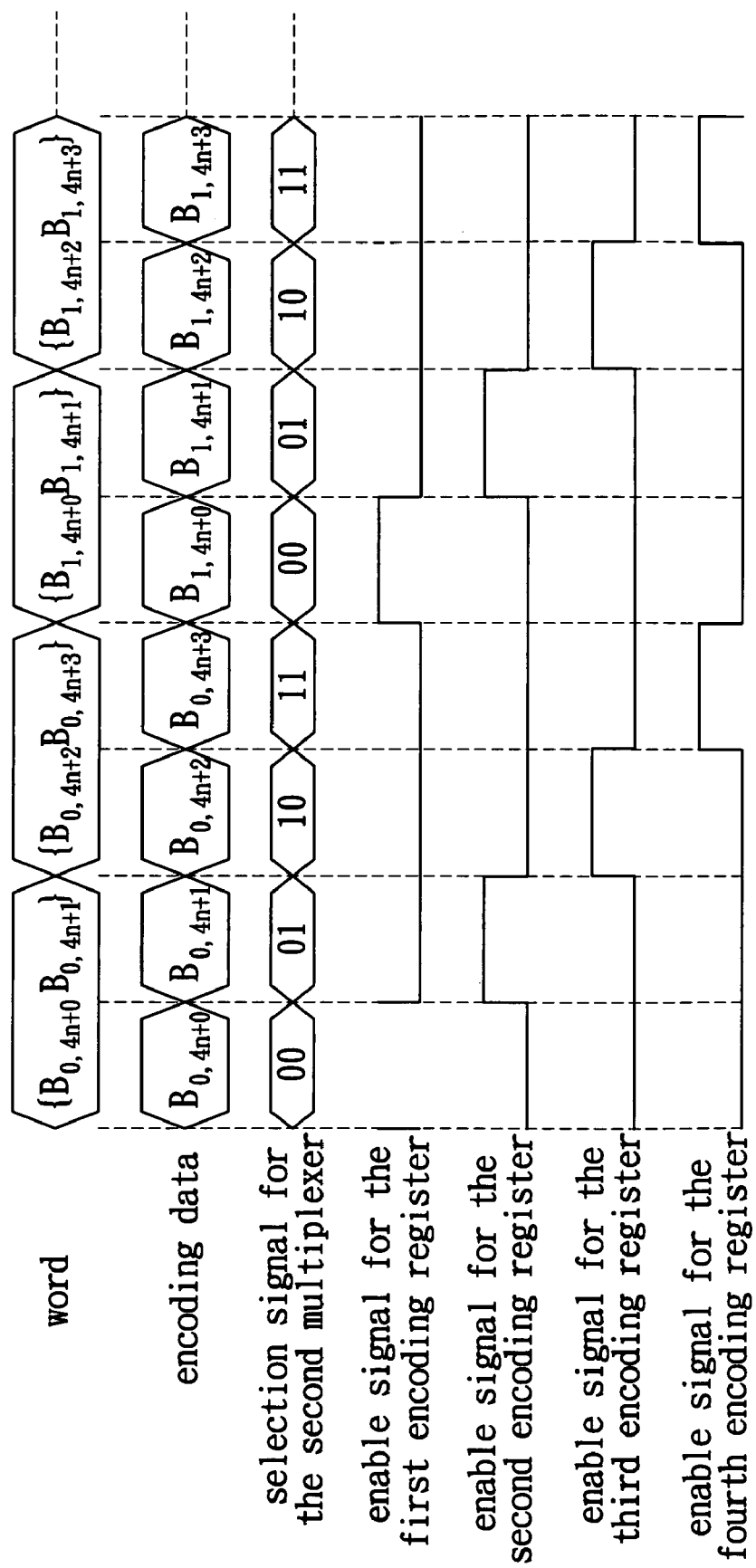
FIG. 10 is schematic diagram illustrating the encoding operation of this embodiment.

Please refer to FIG. 10, which is schematic diagram for illustrating the encoding operation of this embodiment. Each time a word is accessed from the memory 71, the multi-symbol encoder 73 respectively encodes the two data units of the word.

Furthermore, in addition to the embodiment shown in FIG. 8 using multiple encoders and the embodiment shown in FIG. 9 performing multiple encoding operations after a word is accessed, other techniques such as parallel processing or pipelining can also be used to increase the encoding speed of the multi-symbol encoder 73 to make the multi-symbol encoder 73 able to complete the encoding operation of a word within the access time for one word.

Although the present invention has been described with reference to the embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. An encoding device for encoding at least a data block of source data to generate corresponding error correction codes, the data block comprising a plurality of data columns and data rows arranged in a matrix, the encoding device comprising:

a first memory having a page-mode access function and having a plurality of memory pages for storing the data block, wherein the data block is stored in the first memory according to a predetermined order to make storing addresses of data of most of the data rows have a locality, and the data of most of the data rows are stored in the same memory pages, respectively;

a second memory accessing and storing at least two data columns from the first memory, wherein accessing the first memory comprising a plurality of accessing at least two data units within the same data row from the first memory at a time;

an encoder accessing at least a data column from the second memory for encoding; and a memory access controller controlling an access of the first memory.

2. The encoding device of claim 1, wherein the first memory is a dynamic random access memory (DRAM).

3. The encoding device of claim 1, wherein the second memory is a static random access memory (SRAM).

4. The encoding device of claim 1, wherein the error correction codes are parities of outer (PO) codes of Reed-Solomon product codes.

5. The encoding device of claim 1, wherein each of the data units is a symbol of an encoding operation of the error correction codes.

6. An encoding device for encoding at least a data block of source data to generate corresponding error correction codes, the data block comprising a plurality of data columns and data rows arranged in a matrix, the encoding device comprising:

a first memory having a page-mode access function and having a plurality of memory pages for storing the data block, wherein the data block is stored in the first memory according to a predetermined order to make storing addresses of data of most of the data rows have a locality, and the data of most of the data rows is stored in same memory pages, respectively;

a second memory accessing and storing at least a data column from the first memory;

an encoder accessing at least a data column from the first memory or the second memory for encoding; and a memory access controller controlling an access operation of the first memory;

wherein accessing the first memory comprising a plurality of accessing at least two data units within the same data row of the first memory at a time.

7. The encoding device of claim 6, wherein the first memory is a DRAM.

8. The encoding device of claim 6, wherein the second memory is an SRAM.

9. The encoding device of claim 6, wherein the error correction codes are PO codes of a Reed-Solomon product code.

10. The encoding device of claim 6, wherein each of the data units is a symbol of an operation of the error correction codes.

11. An encoding device for encoding at least a data block of source data to generate corresponding error correction codes, the data block comprising a plurality of data columns and data rows arranged in a matrix, the encoding device comprising:

a memory having a page-mode access function and having a plurality of memory pages for storing the data block, wherein the data block is stored in the memory according to a predetermined order to make storing addresses of data of most of the data rows have a locality, and the data of most of the data rows is stored in the same memory pages, respectively;

a multi-symbol encoder accessing a plurality of data columns from the memory for encoding, the multi-symbol encoder accessing a word from the memory every time, the word having a plurality of data units, and the multi-symbol encoder being able to complete an encoding operation related to the word before a next word is accessed from the memory, wherein the multi-symbol encoder accesses at least two data units within the same data row from the memory at a time; and a memory access controller controlling an access operation of the memory.

12. The encoding device of claim 11, wherein the memory is a DRAM.

13. The encoding device of claim 11, wherein the error correction codes are PO codes of Reed-Solomon product code.

14. The encoding device of claim 11, wherein each of the data units is a symbol of the encoding operation of the error correction codes.

15. An encoding method for encoding at least a data block of source data to generate corresponding error correction codes, the data block comprising a plurality of data columns and data rows arranged in a matrix, the encoding method comprising:

providing a first memory having a page-mode access function and having a plurality of memory pages for storing the data block, wherein the data block is stored in the first memory according to a predetermined order to make storing addresses of data of most of the data rows have a locality, and the data of most of the data rows is thereby stored in the same memory pages, respectively;

providing a second memory accessing and storing at least two data columns from the first memory, wherein the second memory accesses at least two data units within the same data row from the first memory at a time;

providing an encoder accessing at least a data column from the second memory for encoding; and providing a memory access controller controlling the access of the first memory.

16. The method of claim 15, wherein the first memory is a DRAM.

17. The method of claim 15, wherein the second memory is an SRAM.

18. The method of claim 15, wherein the error correction codes are PO codes of Reed-Solomon product code.

19. The method of claim 15, wherein each of the data units is a symbol of an encoding operation of the error correction codes.

20. An encoding method for encoding at least a data block of source data to generate corresponding error correction codes, the data block comprising a plurality of data columns and data rows arranged in a matrix, the encoding method comprising:

providing a memory having a page-mode access function and having a plurality of memory pages for storing the data block, wherein the data block is stored in the memory according to a predetermined order to make storing addresses of data of most of the data rows have a locality, and the data of most of the data rows is thereby stored in the same memory pages, respectively;

providing a multi-symbol encoder accessing a plurality of data columns from the memory for encoding, the multi-symbol encoder accessing a word from the memory at a time, the word having a plurality of data units, and the multi-symbol encoder being able to complete the encoding operation related to the word before the next word is accessed from the memory, wherein the multi-symbol encoder accesses at least two data units within the same data row from the memory at a time; and providing a memory access controller controlling an access operation of the memory.

21. The method of claim 20, wherein the memory is a DRAM.

22. The method of claim 20, wherein the error correction codes are PO codes of Reed-Solomon product code.

23. The method of claim 20, wherein each of the data units is a symbol of the encoding operation of the error correction codes.

24. An encoding device for encoding at least a data block of source data to generate corresponding error correction codes, the data block comprising a plurality of data columns and data rows arranged in a matrix, the encoding device comprising:
- a first memory having a page-mode access function and having a plurality of memory pages for storing the data block, wherein the data block is stored in the first memory according to a predetermined order to make storing addresses of data of most of the data rows have a locality, and the data of most of the data rows is thereby stored in the same memory pages, respectively;
- a second memory accessing and storing at least two data columns from the first memory, wherein the second memory accesses at least two data units of adjacent data rows from the first memory at a time;
- an encoder used to access at least a data column from the second memory for encoding; and
- a memory access controller used to control the first memory.

25. The encoding device of claim 24, wherein the first memory is a DRAM.

26. The encoding device of claim 24, wherein the second memory is an SRAM.

27. The encoding device of claim 24, wherein the error correction codes are PO codes of Reed-Solomon product code.

28. The encoding device of claim 24, wherein each of the data units is a symbol of an encoding operation of the error correction codes.

29. An encoding device for encoding at least a data block of source data to generate corresponding error correction codes, the data block comprising a plurality of data columns and data rows arranged in a matrix, the encoding device comprising:
- a first memory having a page-mode access function and having a plurality of memory pages for storing the data block, wherein the data block is stored in the first memory according to a predetermined order to make storing addresses of data of most of the data rows have a locality, wherein the data of most of the data rows is thereby stored in the same memory pages, respectively;
- a second memory accessing and storing at least a data column from the first memory;
- an encoder accessing at least a data column from the first memory or the second memory for encoding; and
- a memory access controller controlling an access operation of the first memory;
- wherein the second memory accesses at least two data units of adjacent data rows from the first memory at a time.

30. The encoding device of claim 29, wherein the first memory is a DRAM.

31. The encoding device of claim 29, wherein the second memory is an SRAM.

32. The encoding device of claim 29, wherein the error correction codes are PO codes of Reed-Solomon product code.

33. The encoding device of claim 29, wherein each of the data units is a symbol of an encoding operation of the error correction codes.

34. An encoding device for encoding at least a data block of source data to generate corresponding error correction codes, the data block comprising a plurality of data columns and data rows arranged in a matrix, the encoding device comprising:
- a memory having a page-mode access function and having a plurality of memory pages for storing the data block, wherein the data block is stored in the memory according to a predetermined order to make storing addresses of data of most of the data rows have a locality, and the data of most of the data rows is thereby stored in the same memory pages, respectively;
- a multi-symbol encoder accessing a plurality of data columns from the memory for encoding, the multi-symbol encoder accessing a word from the memory at a time, the word having a plurality of data units, and the multi-symbol encoder being able to complete an encoding operation related to the word before a next word is accessed from the memory, wherein the multi-symbol encoder accesses at least two data units of adjacent data rows from the memory at a time; and
- a memory access controller controlling the access of the memory.

35. The encoding device of claim 34, wherein the memory is a DRAM.

36. The encoding device of claim 34, wherein the error correction codes are PO codes of Reed-Solomon product code.

37. The encoding device of claim 34, wherein each of the data units is a symbol of the encoding operation of the error correction codes.

* * * * *